United States Patent [19]

Lunquist

[11] 3,922,602

[45] Nov. 25, 1975

[54] LOCK DETECTOR FOR A PHASE LOCKED LOOP

[75] Inventor: Richard Eli Lunquist, Pompano Beach, Fla.

[73] Assignee: Motorola, Inc., Chicago, Ill.

[22] Filed: Oct. 11, 1974

[21] Appl. No.: 513,976

[52] U.S. Cl. .............. 324/83 Q; 307/232; 328/133; 331/64

[51] Int. Cl.² .......................................... G01R 25/00

[58] Field of Search .. 324/83 R, 83 A, 83 Q, 83 FE; 307/232; 331/64; 328/133, 134

[56] References Cited

UNITED STATES PATENTS 3,863,080 1/1975 Steckler ............................. 328/133

*Primary Examiner*—John Kominski
*Attorney, Agent, or Firm*—Eugene A. Parsons; James W. Gillman

[57] ABSTRACT

A quadrature phase detector connected to a phase locked loop so as to receive a first signal from a voltage controlled oscillator in the loop and a second signal from the reference oscillator in the loop, one of said signals being shifted 90°, and providing a pair of differential outputs through resistance elements to the collectors of a pair of common emitter connected transistors in a differential amplifier. The collectors of the transistors are coupled to a voltage source so as to provide a positive feedback to the differential amplifier, and the control electrodes are connected directly to the differential outputs of the phase detector so that the differential amplifier provides two discrete output voltage levels at either of the collectors, which levels indicate lock or unlock in the phase locked loop.

6 Claims, 2 Drawing Figures

LOCK DETECTOR FOR A PHASE LOCKED LOOP

BACKGROUND OF THE INVENTION

A great many phase locked loops (PLL) are being utilized in a variety of circuits and for a variety of purposes. It is often desirable to provide an indication as to when the PLL is in a locked condition. Prior art circuits which provide an indication of lock in a PLL are relatively complicated and expensive. Further, many of the prior art lock detectors provide a continuous or linear signal, rather than discrete levels indicating lock or unlock.

SUMMARY OF THE INVENTION

The present invention pertains to a lock detector for a phase locked loop including a phase detector having first and second inputs connected to the loop to receive an output from a voltage controlled oscillator and an output from a reference oscillator, said phase detector further having a pair of differential outputs each connected through a resistor to the collector of a pair of common emitter connected transistors in a differential amplifier with each of the collectors further connected through a resistor to a voltage source and the control electrodes of each of said transistors connected directly to the differential outputs of the phase detector to provide a positive feedback to cause the differential amplifier to provide two discrete voltage levels at the output thereof.

It is an object of the present invention to provide a new and improved lock detector for a phase locked loop.

It is a further object of the present invention to provide a new and improved lock detector for a phase locked loop which provides two discrete voltage levels at the output thereof indicative of lock or unlock in the loop.

It is a further object of the present invention to provide a new and improved lock detector for a phase locked loop including a quadrature phase detector having differential outputs connected to a differential amplifier so as to provide a positive feedback to cause said differential amplifier to provide two discrete voltage levels at the output thereof.

These and other objects of this invention will become apparent to those skilled in the art upon consideration of the accompanying specification, claims and drawing.

DESCRIPTION OF THE PREFERRED EMBODIMENT

Figures 1, 2:
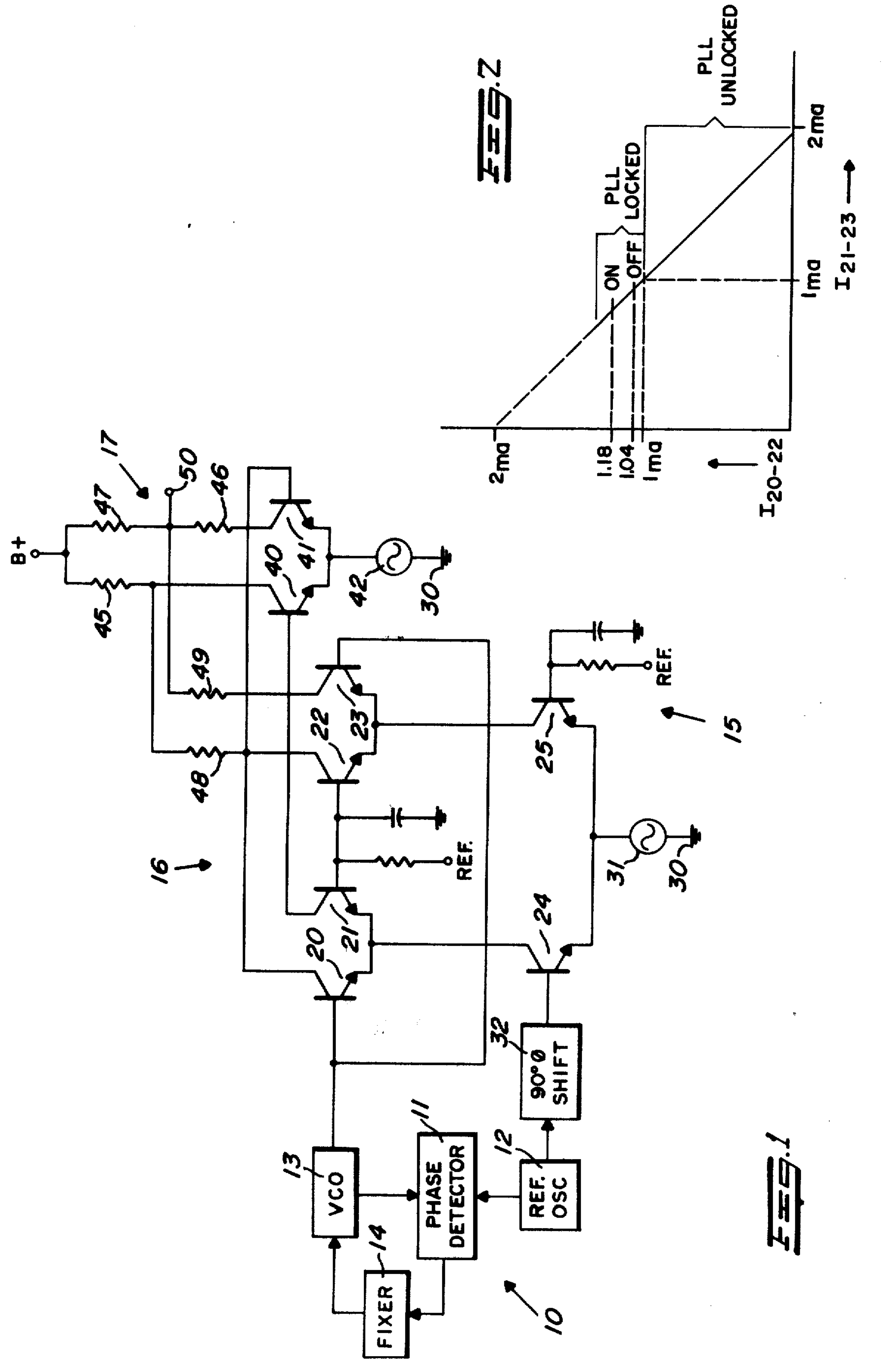
FIG. 1 is a semi-block/semi-schematic diagram of a phase locked loop with a lock detector embodying the present invention connected thereto.
FIG. 2 is a graphical representation of currents flowing in the phase detector of the lock detector illustrated in FIG. 1.

Referring specifically to FIG. 1, the numeral 10 generally designates a phase locked loop including a phase detector 11, a reference oscillator 12 supplying a signal to one input of the phase detector 11, a voltage controlled oscillator 13 supplying a signal to a second input of the phase detector 11 and a filter 14 connecting the output of the phase detector 11 to the voltage control input of the voltage controlled oscillator 13. The phase locked loop 10 is shown in very general form because it does not form a portion of the present lock detector and it should be understood that the lock detector can be associated with substantially any phase locked loop. An embodiment of the lock detector, illustrated in the FIG. 1, is generally designated 15 and includes a quadrature phase detector generally designated 16 and a differential amplifier generally designated 17.

The phase detector 16 includes a first pair of common emitter connected NPN type transistors 20 and 21, a second pair of common emitter connected NPN type transistors 22 and 23, and a third pair of common emitter connected NPN type transistors 24 and 25. The common connected emitters of the first pair of transistors 20 and 21 are connected directly to the collector of the transistor 24 and the common connected emitters of the second pair of transistors 22 and 23 are connected directly to the collector of the transistor 25. The common connected emitters of the third pair of transistors 24 and 25 are connected to a reference potential, such as ground 30 through a constant current source 31, illustrated symbolically since the particular type of constant current source is not essential to the present invention. The bases of the transistors 20 and 23 are connected to an output of the voltage controlled oscillator 13 and the base of the transistor 24 is connected to an output of a 90° phase shift circuit 32, which in turn receives an output from the reference oscillator 12. The bases of the transistors 21, 22 and 25 are connected to AC ground to provide a second input for the differential phase detector circuits. While the outputs of the voltage controlled oscillator 13 and the 90° phase shift circuit 32 are illustrated as single outputs, it should be understood that a differential output might be applied to the bases of the transistors 20–23 and 24, 25 in a fashion well known to those skilled in the art. The collectors of the first pair of transistors 20 and 21 are connected directly to the collectors of the second pair of transistors 22 and 23, respectively. The collectors of the second pair of transistors 22 and 23 form a differential output for the phase detector 16.

The differential amplifier 17 includes a pair of common emitter connected NPN type transistors 40 and 41. The common connected emitters of the transistors 40 and 41 are connected to ground 30 through a constant current source 42, likewise shown symbolically, since no specific type of constant current source is required. The collector of the transistor 22 in the phase detector 16 is connected directly to the base of the transistor 41 and the collector of the transistor 23 in the phase detector 16 is connected directly to the base of the transistor 40. The collector of the transistor 40 is connected through a resistor 45 to a terminal marked B+ adapted to have a voltage supply connected thereto (not shown). The collector of the transistor 41 is connected through a pair of series connected resistors 46 and 47 to the terminal B+. The collector of the transistor 40 is also connected through a resistor 48 to the collector of the transistor 22 in the phase detector 16 and the junction of the resistors 46 and 47 is connected through a resistor 49 to the collector of the transistor 23 in the phase detector 16. The junction of the resistors 46 and 47 also provides an output for the lock detector 15 on a terminal designated 50.

In the operation of the present lock detector, the phase detector 16 is driven in quadrature with the phase detector 11 in the phase locked loop 10 so as to provide an output level at or near one end of its "phase input to voltage output" characteristic when the phase locked loop 10 is in a locked condition. When the phases of the signals from the voltage controlled oscillator 13 and the 90° phase shift circuit 32 are such that the collectors of the transistors 20 and 22 become more positive than the collectors of the transistors 21 and 23, this positive differential voltage is applied between the bases of the transistors 41 and 40 causing the transistor 41 to begin to conduct. As transistor 41 conducts the potential at the junction of the resistors 46 and 47 begins to drop, therefore, causing a greater drop in the potential at the collectors of the transistors 21–23. The increased drop in the potential on the collector of the transistors 21–23 is applied to the base of the transistor 40 causing that transistor to conduct less. This procedure continues until substantially all of the current of the constant current source 42 is flowing through the transistor 41 and substantially no current is flowing through the transistor 40. When this occurs the terminal 50 is at a low potential indicating an unlocked condition for the phase locked loop 10.

In a similar fashion, when the collectors of the transistors 21–23 are at a greater potential than the collectors of the transistors 20–22, the transistor 41 conducts very little current and the transistor 40 conducts substantially all of the current of the constant current source 42 so that the terminal 50 is high, indicating a locked condition for the phase locked loop 10.

Referring to FIG. 2, a plot of the collector currents, $I_{20-23}$, of transistors 20 and 22 versus the collector currents, $I_{21-23}$, of transistors 21 and 23 is illustrated. From this diagram it can be seen that the phase locked loop 10 is in a locked condition when the collector current of transistors 20–22 exceeds the collector current of transistors 21–23. Further, when the collector currents of transistors 20–22 and 21–23 are equal or when the collector current of transistor 21–23 exceeds the collector current of transistor 20–22, the phase locked loop 10 is in an unlocked condition. In the diagram of FIG. 2 it is assumed that the constant current source 31 conducts a two milliamp current. Therefore, the following equations apply:

$$V_{20-22} = B+ - R_{45} (I_{20-22} + I_{40}) - R_{48} I_{20-22}$$
$$V_{21-23} = B+ - R_{47} (I_{21-23} + I_{41}) - R_{48} I_{21-23}$$
$$I_{20-22} + I_{21-23} = 2 \text{ ma.}$$

Where $V_{20-22}$ is the voltage at the collectors of transistors 20–22 and $V_{21-23}$ is the voltage at the collectors of transistors 21–23. If it is assumed that the differential amplifier 17 has relatively high gain, the total current will flow through whichever transistor is "on", and the crossover will occur at the point at which the base voltages are substantially equal. Accordingly with the constant current source 42 conducting, say for example, 1 milliamp of current and the collector current, $I_{40}$, of transistor 40 zero, the collector current, $I_{41}$, of the transistor 41 is 1 milliamp, and $V_{20-22}$ and $V_{21-23}$ can be equated to determine the threshold "on" current.

$$B+ - R_{45} (I_{20-22} + I_{40}) - R_{48} I_{20-22} = B+ - R_{47} (I_{21-23} + I_{41}) - R_{49} I_{21-23}$$
$$R_{45} I_{20-22} + R_{48} I_{20-22} = R_{47} (I_{21-23} + 1) + R_{49} I_{21-23}$$

Since $I_{21-23} = 2 - I_{20-22}$, then $$I_{20-22} (R_{48} + R_{45}) = R_{47} (2 - I_{20-22}) + R_{47} + R_{49} (2 - I_{20-22})$$
$$I_{20-22} (R_{48} + R_{45} + R_{47} + R_{49}) = 3R_{47} + 2R_{49}$$
$$I_{20-22} = 3R_{47} + 2R_{49}$$

threshold "on" current (ma.)

$$R_{48} + R_{45} + R_{47} + R_{49}$$

Similarly, the "Off" threshold current occurs when the collector voltage of transistors 20–22 equals the collector voltage of transistors 21–23 and the collector current of transistor 40 is approximately 1 while the collector current of transistor 41 is approximately 0. Under these conditions the above equations result in the following:

$$R_{45} (I_{20-22} + 1) + R_{48} I_{20-22} = R_{47} (I_{21-23} + 0) + R_{49} I_{21-23}$$
$$I_{20-22} (R_{45} + R_{48}) + R_{45} = (R_{49} + R_{47}) (2 - I_{20-22})$$
$$I_{20-22} (R_{45} + R_{48} + R_{49} + R_{47}) = 2 (R_{49} + R_{47}) - R_{45}$$
$$I_{20-22} = 2 (R_{49} + R_{47}) - R_{45}$$

threshold "off" current (ma.)

$$R_{48} + R_{45} + R_{49} + R_{47}$$

In the present embodiment, the values of the various components utilized in the above formulas are as follows:

$R_{48} = 1800$ ohms
$R_{49} = 2000$ ohms
$R_{45} = 200$ ohms
$R_{47} = 400$ ohms
$R_{46} = 1200$ ohms
$B+ = 7.5$ volts With the values as listed, the threshold "on" current for transistors 20–23 is 1.18 milliamps and the threshold "off" current is 1.04 milliamps. The threshold "on" current and the threshold "off" current are illustrated in the diagram of FIG. 2. Referring to FIG. 2, when the phase locked loop 10 is in an unlocked condition and moving towards a locked condition the lock detector 15 does not indicate a locked condition until the current $I_{20-22}$ reaches 1.18 milliamps. Similarly, when the phase locked loop 10 is in a locked condition and approaches an unlocked condition the lock detector 15 does not indicate the unlocked condition until the collector current of the transistors 20–22 reaches 1.04 milliamps. Thus, the present circuit incorporates hysteresis so that noise or minor variations of the phase locked loop do not cause a change in the status indicated by the lock detector 15. The value of resistor 46 determines the amount of deviation between the two descrete levels provided at the terminal 50 and can be selected to provide substantially any desired amount of deviation, provided that the collector current flowing through transistor 41 does not cause transistor 41 to saturate.

Thus, a new and improved phase locked loop lock detector is disclosed which incorporates regeneration or positive feedback by connecting the differential outputs (the collectors of transistors 22 and 23) of the phase detector through a pair of resistors 48 and 49 to the voltage source through a second pair of resistors 45 and 47, respectively, which second pair of resistors also supply current to the collectors of transistors 40 and 41 in the differential amplifier. This positive feedback or regeneration causes the lock detector to provide two discrete levels at the output terminal 50 indicative of the locked or unlocked condition of the phase locked loop 10. Further, the lock detector incorporates hysteresis to prevent noise and other minor variations from affecting the indication.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A lock detector for a phase locked loop including a voltage controlled oscillator and a reference oscillator, said lock detector comprising:

a. a phase detector having first and second inputs and a pair of differential outputs;

b. said phase detector being coupled to the loop with the first input receiving an output signal from the voltage controlled oscillator and the second input receiving an output signal from the reference oscillator;

c. a differential amplifier having a pair of inputs connected to the differential outputs of said phase detector and further having a pair of outputs; and d. means coupling the differential outputs of said phase detector to the pair of outputs of said differential amplifier for providing a positive feedback to cause said differential amplifier to provide two discrete voltage levels at the outputs thereof.

2. A lock detector as claimed in claim 1 wherein the phase detector is a quadrature phase detector and one of the output signals from the voltage controlled oscillator and the reference oscillator is coupled through a phase shifting network.

3. A lock detector as claimed in claim 2 wherein the phase shifting network is approximately a 90° phase shift.

4. A lock detector as claimed in claim 1 wherein the coupling means includes a first resistor in each of the pair of differential outputs of the phase detector and a second resistor in each of the outputs of the pair of outputs of the differential amplifier, each of said first resistors being connected in series with a different one of said second resistors.

5. A lock detector for a phase locked loop including a voltage controlled oscillator and a reference oscillator, said lock detector comprising:

a. a phase detector having first and second inputs and a pair of emitter coupled transistors each having a collector serving as an output;

b. said phase detector being coupled to the loop with the first input receiving an output signal from the voltage controlled oscillator and the second input receiving an output signal from the reference oscillator;

c. a differential amplifier including a pair of emitter coupled transistors each having a collector connected to a power supply through separate resistors, said collectors serving as outputs of said differential amplifier, and each having a control electrode connected to a different one of the collectors of said phase detector for supplying input signals to said differential amplifier; and d. a pair of resistors each coupled at one end to a different collector of said transistors in said differential amplifier and each coupled at the other end to a different collector of said transistors in said phase detector for providing a positive feedback to cause said differential amplifier to provide two discrete voltage levels at the outputs thereof.

6. A lock detector as claimed in claim 5 wherein the phase detector is a quadrature phase detector and one of the output signals from the voltage controlled oscillator and the reference oscillator is coupled through a 90° phase shifting network.

* * * * *